US011289147B2

(12) United States Patent
Di Vincenzo et al.

(10) Patent No.: US 11,289,147 B2
(45) Date of Patent: Mar. 29, 2022

(54) SENSING TECHNIQUES FOR A MEMORY CELL

(71) Applicant: Micron Technology, Inc., Boise, ID (US)

(72) Inventors: Umberto Di Vincenzo, Capriate San Gervasio (IT); Efrem Bolandrina, Fiorano al Serio (IT); Riccardo Muzzetto, Arcore (IT); Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/165,529

(22) Filed: Feb. 2, 2021

(65) Prior Publication Data

US 2021/0233578 A1    Jul. 29, 2021

Related U.S. Application Data

(63) Continuation of application No. 16/515,666, filed on Jul. 18, 2019, now Pat. No. 10,916,288.

(51) Int. Cl.
*G11C 7/00* (2006.01)
*G11C 11/22* (2006.01)

(52) U.S. Cl.
CPC ........ *G11C 11/2273* (2013.01); *G11C 11/221* (2013.01); *G11C 11/2259* (2013.01)

(58) Field of Classification Search
CPC ....... G11C 7/1051; G11C 7/22; G11C 7/1006; G11C 7/1072; G11C 7/1066
USPC ...................................... 365/189.14, 189.15
See application file for complete search history.

(56) References Cited

U.S. PATENT DOCUMENTS 10,818,343 B2 * 10/2020 Raad ..................... G11C 7/065
2007/0121377 A1   5/2007 Kajiyama

* cited by examiner

*Primary Examiner* — Son T Dinh
(74) *Attorney, Agent, or Firm* — Holland & Hart LLP

(57) ABSTRACT

Methods, systems, and devices for sensing techniques for a memory cell are described to enable a latch to sense a logic state of a memory cell. A transistor coupled with a memory cell may boost a first voltage associated with the memory cell to a second voltage via one or more parasitic capacitances of the transistor. The second voltage may be developed on a first node of a sense component, and the second voltage may be shifted to a third voltage at a first node of the sense component by applying a voltage to a shift node coupled with a capacitor of the sense component. Similar boosting and shifting operations may be performed to develop a reference voltage on a second node of the sense component. The sense component may sense the state of the memory cell by comparing with the reference voltage.

20 Claims, 10 Drawing Sheets

SENSING TECHNIQUES FOR A MEMORY CELL

CROSS REFERENCE

The present application for patent is a continuation of U.S. patent application Ser. No. 16/515,666 by Di Vincenzo et al., entitled "SENSING TECHNIQUES FOR A MEMORY CELL," filed Jul. 18, 2019, assigned to the assignee hereof, and is expressly incorporated by reference in its entirety herein.

BACKGROUND

The following relates generally to a system that includes at least one memory device and more specifically to sensing techniques for a memory cell.

The following relates generally to a system that includes at least one memory device and more specifically to sensing techniques for a memory cell.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Some memory devices (e.g., FeRAM devices) may include one or more components coupled with a memory cell that may be dedicated for performing one or more sense operations associated with the memory cell. Some components included in the memory device may increase the size or footprint of the memory device, introducing extra costs and manufacturing complexity.

DETAILED DESCRIPTION

Figure 1:
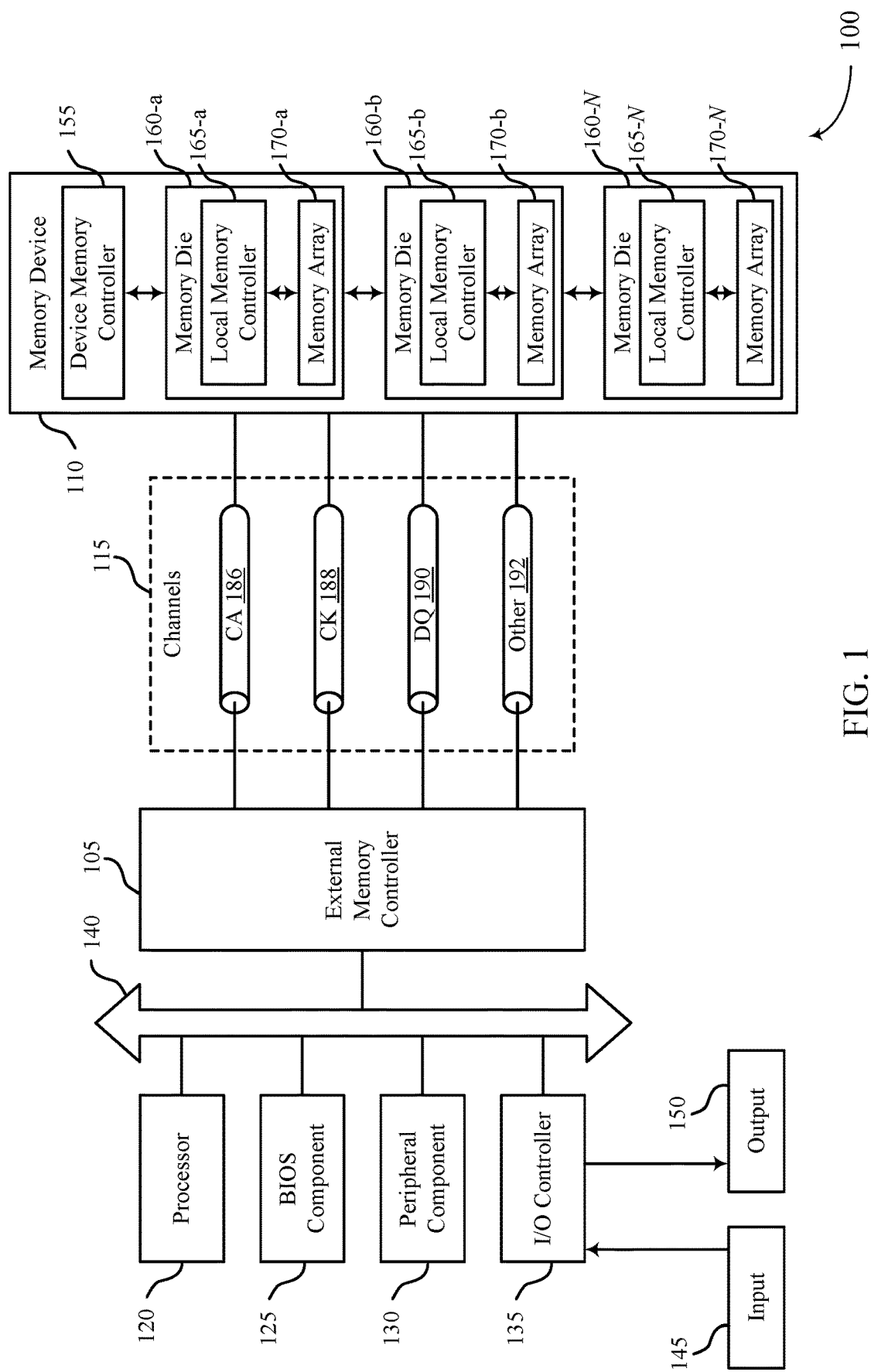
FIG. 1 illustrates an example of a system that supports sensing techniques for a memory cell in accordance with examples as disclosed herein.

A memory device may perform one or more sensing operations with respect to a memory cell in order to sense or read a logic state of the memory cell (e.g., via one or more components of the memory device). For example, during a read operation, a memory cell may be coupled (e.g., by activating a word line and a cascode) with a sense component (e.g., a latch) via a transistor in a source-follower configuration. The sense component may sense the state of the memory cell by comparing a voltage signal associated with the memory cell to a reference voltage (e.g., by latching or firing the voltage signal and the reference voltage). In some cases, a first voltage associated with the memory cell may be boosted to a second voltage, which then may be shifted to a third voltage (e.g., a voltage lower than the second voltage) before being sensed by the sense component. The boosting and the shifting may enable the third voltage to develop a usable signal, and may enable the third voltage to correspond to a voltage level used by the sense component. In this manner, a more reliable signal may be developed from the memory cell and a lower voltage sense component may be used. In some examples, the boosting and shifting may be performed by an additional capacitor located between the memory cell and the sense component. However, the additional capacitor may increase the footprint of the memory device, or, if the additional capacitor is reduced in size, it may have a reduced ability to boost and shift the respective voltages.

Therefore, in some cases, the footprint of the memory device may be reduced by boosting the first voltage to the second voltage using one or more parasitic capacitances of the transistor, and by shifting the second voltage to the third voltage using one or more capacitors associated with the sense component. A drain and a source of the transistor may transition from a grounded state to a high-voltage state when the transistor is activated. This transition may boost the first voltage to a second voltage through one or more feedback parasitic capacitances associated with a metal oxide semiconductor (MOS) of the transistor. A transistor coupling the transistor and the sense component may be switched on and off to develop the second voltage on a first node of the sense component and then isolate the sense component from the transistor.

The second voltage may be shifted to a third voltage at the first node of the sense component, which may be coupled with a first plate of a capacitor. A signal may be driven to a second plate of the capacitor. For example, the signal on the second plate may go from a fourth voltage to a fifth (e.g., lower) voltage to shift the second voltage at the first node to the third voltage at the first node. Similar boosting and shifting operations may be performed to develop a reference voltage on a second node of the sense component. The sense component may sense the state of the memory cell by comparing the third voltage with the reference voltage.

Features of the disclosure are initially described in the context of a memory system and memory die as described with reference to FIGS. 1-3. Features of the disclosure are described in the context of circuit diagrams and a timing diagram as described with reference to FIGS. 4-6. These and other features of the disclosure are further illustrated by and described with reference to an apparatus diagram and flowcharts that relate to sensing techniques for a memory cell as described with references to FIGS. 7-10.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth.

In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2. A memory array may include one or more memory cells that are coupled with a sense component via a transistor in a source-follower configuration, where the transistor may be configured to boost a memory cell voltage and one or more capacitors of the sense component may be configured to shift the boosted voltage.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120). One or more of the memory controllers may be operable to boost a memory cell voltage via one or more parasitic capacitances of a transistor in a source-follower configuration during a sense operation. One or more of the memory controllers may also be operable to shift the boosted voltage via one or more capacitors of a sense component during the sense operation.

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (e.g., including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended.

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths. In some cases, the other channels 192 may include one or more write clock signal (WCK) channels. In some cases, the other channels 192 may include one or more error detection code (EDC) channels.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Memory cells of a memory array 170 (e.g., or a memory device) may be coupled with a transistor in a source-follower configuration configured to boost a first memory cell voltage to a second voltage using one or more parasitic capacitances during a sense operation. The transistor may be coupled with a sense component that may be configured to shift the second voltage to a third voltage using one or more capacitors associated with the sense component. The transistor may boost the first voltage to the second voltage, and a transistor coupling the transistor and the sense component may be switched on and off in order to develop the second voltage on a first node of the sense component and then isolate the sense component from the transistor. The second voltage may be shifted to a third voltage at the first node of the sense component, which may be coupled with a first plate of a capacitor. A second plate of the capacitor may be coupled with a shift node, and the shift node may be driven to a lower voltage in order to shift the second voltage to the third voltage at the first node (e.g., via the capacitor). Similar boosting and shifting operations may be performed to develop a reference voltage on a second node of the sense component, and the sense component may sense the state of the memory cell by comparing the third voltage with the reference voltage (e.g., by latching or firing the third voltage and the reference voltage).

Figure 2:
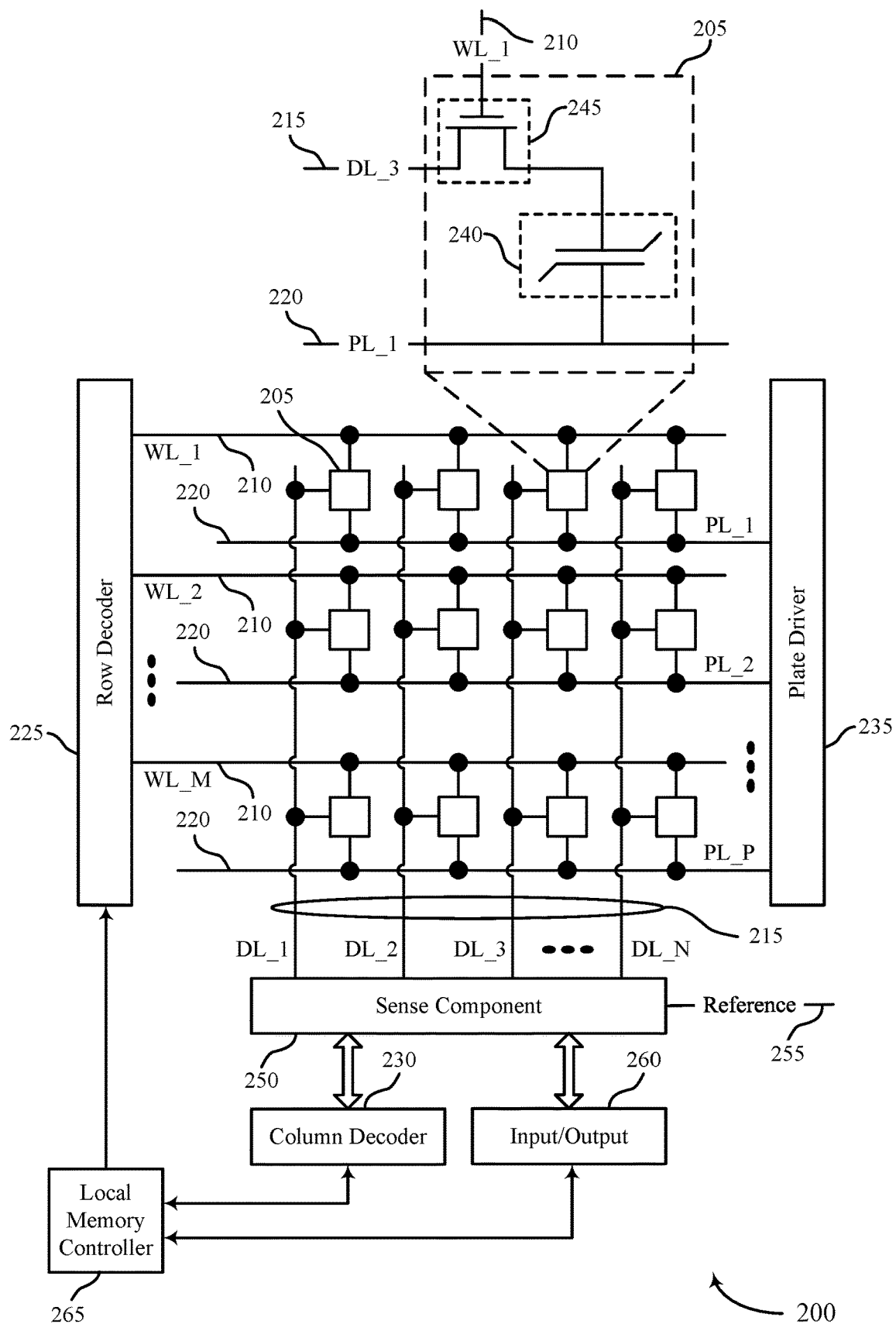
FIG. 2 illustrates an example of a memory die that supports sensing techniques for a memory cell in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of information at a time (e.g., a logic 0 or a logic 1). In some cases, a single memory cell 205 (e.g., a multi-level memory cell) may be configured to store more than one bit of information at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215. A digit line 215 may be couple (e.g., selectively couple) a memory cell 205 with a sense component 250 via a transistor in a source-follower configuration. During a read or sense operation, the digit line 215 may access a memory cell 205 and transfer a voltage associated with the memory cell to the transistor.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. The sense component 250 may include various transistors or amplifiers to detect and amplify a difference in the signals. The detected logic state of the memory cell 205 may be provided as an output of the sense component 250 (e.g., to an input/output 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235. A sense component 250 may be selectively couplable with a memory cell 205 via a transistor in source-follower configuration. The transistor may boost a voltage associated with the memory cell 205, and may be coupled with the sense component 250 to transfer the boosted voltage. The sense component 250 may receive and shift the boosted voltage and may compare the shifted voltage to a reference voltage to determine a logic state of the memory cell 205.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200. A memory controller may be operable to boost a memory cell 205 voltage via one or more parasitic capacitances of a transistor in a source-follower configuration during a sense operation. A memory controller may also be operable to shift the boosted voltage via one or more capacitors of a sense component 250 during the sense operation.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may activate a target word line 210, a target digit line 215, and/or a target plate line 220 (e.g., applying a voltage to the word line 210, digit line 215, or the plate line 220) to apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

The local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

During a sense portion of a read operation, a transistor coupled with a memory cell 205 may boost a first voltage associated with the memory cell 205 to a second voltage (e.g., via one or more parasitic capacitances of the transistor). A transistor coupling the transistor and a sense component 250 may be switched on and off in order to develop the second voltage on a first node of the sense component 250 and then isolate the sense component 250 from the transistor. The second voltage may be shifted to a third voltage at a first node of the sense component 250, which may be coupled with a first plate of a capacitor. A second plate of the capacitor may be coupled with a shift node, and the shift node may be driven to a lower voltage in order to shift the second voltage to the third voltage at the first node (e.g., via the capacitor). Similar boosting and shifting operations may be performed to develop a reference voltage on a second node of the sense component 250, and the sense component 250 may sense the state of the memory cell by comparing the third voltage to the reference voltage (e.g., by latching or firing the third voltage and the reference voltage).

Figure 3A:
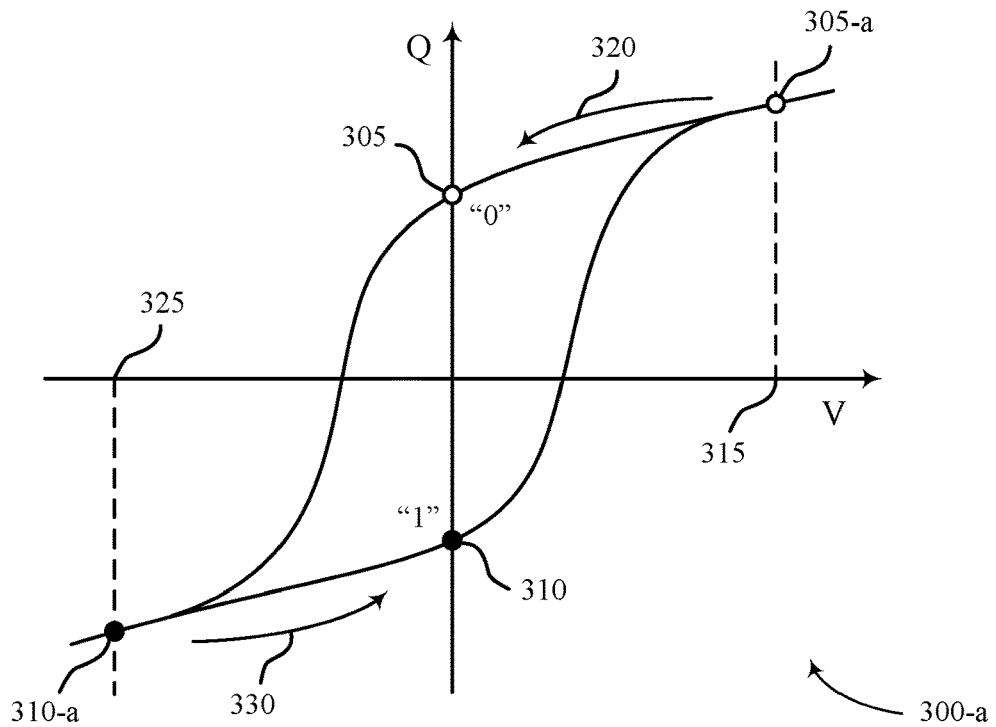
FIGS. 3A and 3B illustrate examples of hysteresis curves that support sensing techniques for a memory cell in accordance with examples as disclosed herein.
Figure 3B:
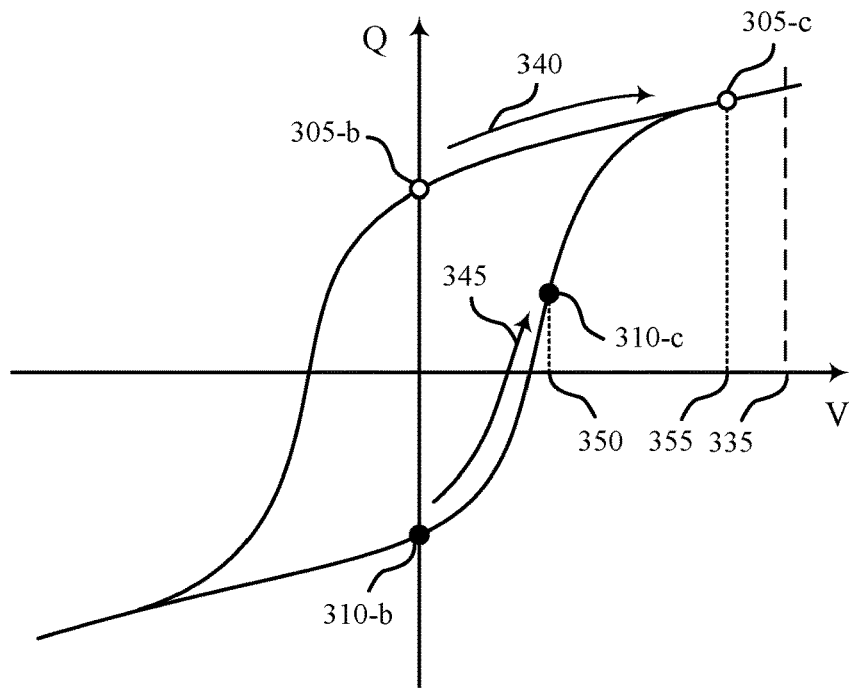

FIGS. 3A and 3B illustrate examples of non-linear electrical properties of a ferroelectric memory cell with hysteresis curves 300-a and 300-b in accordance with various examples as disclosed herein. Hysteresis curves 300-a and 300-b illustrate an example ferroelectric memory cell writing and reading process, respectively. Hysteresis curves 300-a and 300-b depict the charge, Q, stored on a ferroelectric capacitor (e.g., capacitor 240 described with reference to FIG. 2) as a function of a voltage difference, V.

A ferroelectric material is characterized by a spontaneous electric polarization, that is, it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 300-a and 300-b represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero-voltage difference, resulting in two possible charged states: a charge state 305 and a charge state 310. According to the examples of FIGS. 3A and 3B, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor 240 as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on one or more factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. A voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., the difference between the voltage 335 and the voltage 350 or the different between the voltage 335 and the voltage 355. A reference voltage may be generated such that its magnitude is between the two possible voltages of the two possible digit line voltages to determine the stored logic state—i.e., if the digit line voltage is higher or lower than the reference voltage. Upon comparison by the sense component, the sensed digit line voltage may be determined to be higher or lower than the reference voltage, and the stored logic value of the ferroelectric memory cell (i.e., a logic 0 or 1) may be determined.

In some cases, a ferroelectric memory cell may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction. In some cases, a ferroelectric memory cell may lose its initial logic state after a read operation. For example, if charge state 310-b is stored, the charge state may follow path 345 to charge state 305-c during a read operation and, after removing voltage 335, the charge state may relax to the charge state 305-b by following path 340.

Hysteresis curve 300-b illustrates an example of reading a memory cell that is configured to store the charge state 305-b and the charge state 310-b. A read voltage 335 may be applied, for example, as a voltage difference via a digit line 215 and a plate line 220 as described with reference to FIG. 2. Hysteresis curve 300-b may illustrate read operations where the read voltage 335 is negative voltage difference Vcap (e.g., where Vbottom−Vplate is negative). A negative read voltage across the capacitor may be referred to as a "plate high" read operation, where a plate line 220 is taken initially to a high voltage, and a digit line 215 is initially at a low voltage (e.g., a ground voltage). Although read voltage 335 is shown as a negative voltage across the ferroelectric capacitor 240, in alternative operations a read voltage may be a positive voltage across the ferroelectric capacitor 240, which may be referred to as a "plate low" read operation.

The read voltage 335 may be applied across the ferroelectric capacitor 240 when a memory cell 205 is selected (e.g., by activating a switching component 245 as described with reference to FIG. 2). Upon applying the read voltage 335 to the ferroelectric capacitor 240, charge may flow into or out of the ferroelectric capacitor 240 via the digit line 215 and plate line 220, and different charge states may result depending on whether the ferroelectric capacitor 240 was at charge state 305-a (e.g., a logic 1) or at charge state 310-a (e.g., a logic 0).

During a sense portion of a read operation, the signal developed from a memory cell may be boosted from a first voltage to a second voltage using one or more parasitic capacitances of a transistor in a source-follower configuration. The second voltage may be shifted to a third voltage at a first node of the sense component using a capacitor. A first plate of a capacitor may be coupled with the first node and a second plate of the capacitor may be coupled with a shift node. The shift node may be driven to a lower voltage to shift the second voltage to the third voltage at the first node (e.g., via the capacitor).

Figure 4:
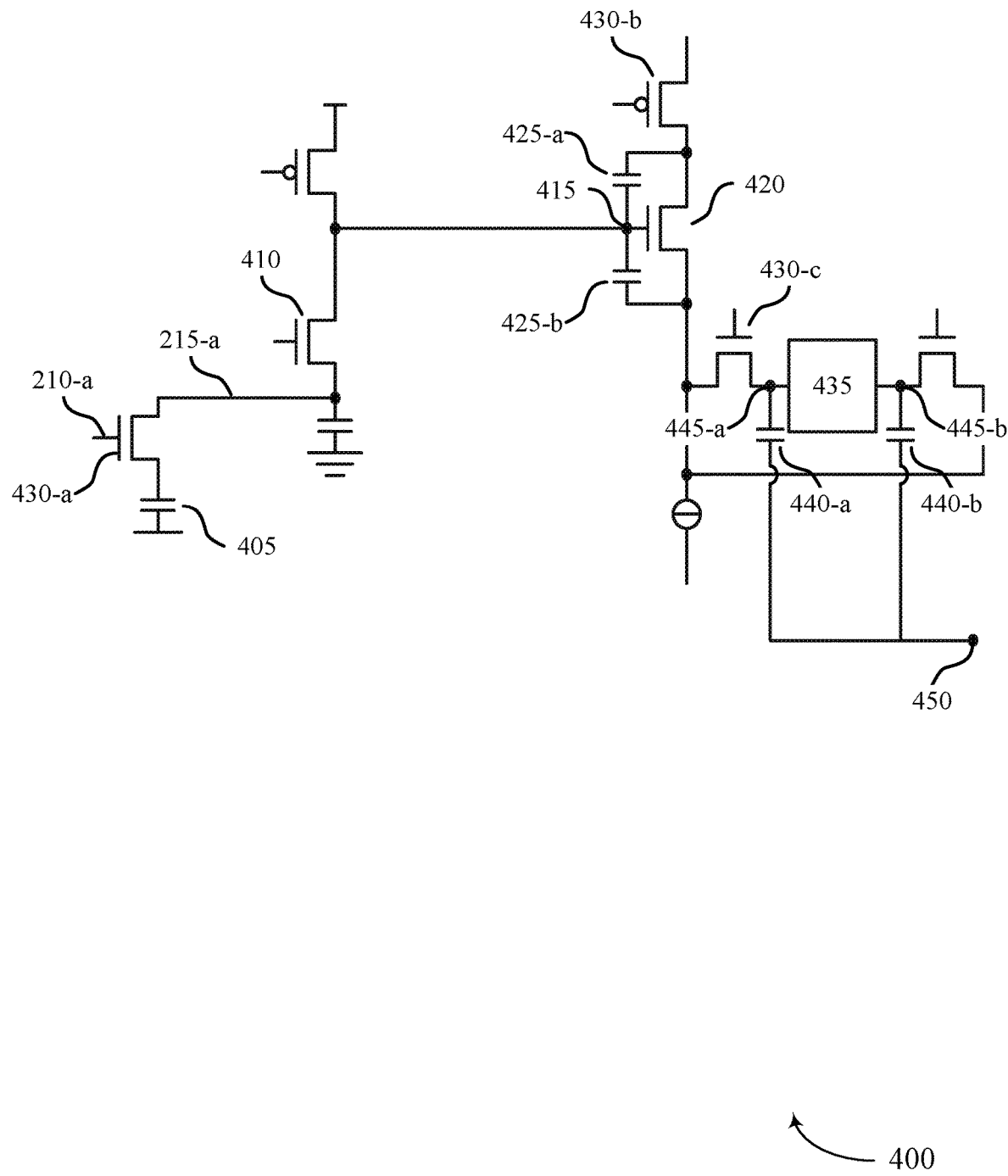
FIG. 4 illustrates an example of a circuit diagram that supports sensing techniques for a memory cell in accordance with examples as disclosed herein.

FIG. 4 illustrates an example of a circuit diagram 400 that supports sensing techniques for a memory cell in accordance with examples as disclosed herein. In some examples, circuit diagram 400 may represent a portion of a memory device, where the memory device may include components of a memory die as described with reference to FIG. 2. For example, circuit diagram 400 may be associated with a memory cell 405, which may be an example of a memory cell described with reference to FIGS. 2 and 3. Circuit diagram 400 may also include a word line 210-a, a digit line 215-a, and a sense component 435 (e.g., a latch), which may be coupled with memory cell 405 and may be examples of a word line 210, a digit line 215, and a sense component described with reference to FIG. 2. The circuit illustrated in circuit diagram 400 may be configured to perform one or more sensing operations of the memory cell 405 to sense a logic state stored on the memory cell 405.

For example, transistor 430-a may be activated by applying a voltage to word line 210-a, thereby connecting digit line 215-a to memory cell 405. A cascode 410 may also be activated (e.g., a current from memory cell 405 may flow into cascode 410), coupling the memory cell 405 to sense component 435 via a transistor 420 in a source-follower configuration. Upon activating transistor 420 (e.g., via a transistor 430-b), a voltage signal associated with a logic state of memory cell 405 may be integrated on an integration node 415 (e.g., to develop a higher-voltage signal) and transferred to sense component 435. Digit line 215-a may be disconnected from integration node 415 (e.g., by deactivating cascode 410) once the voltage signal is developed on integration node 415. A transistor 430-c (e.g., a transistor) may also be deactivated to isolate the sense component 435 from transistor 420, and sense component 435 may sense the logic state of memory cell 405 by comparing the voltage signal to the reference voltage (e.g., by latching or firing the voltage signal and the reference voltage).

A first voltage associated with memory cell 405 may be boosted to a second voltage (e.g., via the integration), which may be shifted to a third voltage (e.g., a voltage lower than the second voltage) before reaching the sense component 435. The boosting and the shifting may enable the third voltage to develop a signal from the memory cell that reduces a bit error rate, and may enable the third voltage to correspond to a voltage level employed by sense component 435. In this manner, the size of the signal from the memory cell may be larger while the size and components of the sense component may be smaller. In some examples, the boosting and shifting may be performed by an additional capacitor located between memory cell 405 and sense component 435. However, the additional capacitor may increase the footprint of the memory device, or, if the additional capacitor is reduced in size, it may have a reduced ability to boost and shift the respective voltages. Therefore, in some cases, the footprint of the memory device may be reduced by boosting the first voltage to the second voltage using a parasitic capacitance 425 of transistor 420 and shifting the second voltage to the third voltage using one or more capacitors 440 associated with sense component 435.

For example, as described above, transistor 430-a and cascode 410 may be activated, and transistor 430-b may be activated to switch on transistor 420 (e.g., where transistor 420 may be in a source-follower configuration). When transistor 430-b switches on, parasitic capacitances 425-a and/or 425-b associated with transistor 420 may boost a first voltage associated with memory cell 405. In some cases, parasitic capacitances 425-a and 425-b may represent physical components of the circuit. In some cases, parasitic capacitances 425-a and 425-b may not represent physical components of the circuit, and may instead represent a parasitic capacitance associated with one or more physical components of transistor 420. In one example, a drain and a source of transistor 420 may transition from a grounded state to a high-voltage state when transistor 430-b switches on. This transition may boost the first voltage to a second voltage using the parasitic capacitances 425-a and 425-b associated with a MOS of transistor 420. As such, the second voltage (e.g., second voltage signal) may be developed on integration node 415 across parasitic capacitances 425-a and 425-b (e.g., mainly on parasitic capacitance 425-a).

In some examples, transistor 430-c (e.g., a transistor) may be switched on, such that the second voltage may also be applied to a first node 445-a of sense component 435. Transistor 430-c may be switched off once the second voltage is developed on first node 445-a, such that sense component 435 may be isolated from the transistor 420 and the memory cell 405. The second voltage may be shifted to a third voltage at first node 445-a, where first node 445-a may be coupled with a first plate of a capacitor 440-a. Capacitor 440-a may store data associated with memory cell 405, as represented by the second or third voltage. In some cases, a second plate of capacitor 440-a may be coupled with a shift node 450, and the shift node 450 may be driven to a lower voltage in order to shift the second voltage to the third voltage at first node 445-a (e.g., via capacitor 440-a). A similar shifting operation may be performed on a second node 445-b of the sense component 435, where second node 445-b may be configured to develop a reference voltage, and may be coupled with a capacitor 440-b and with shift node 450. Sense component 435 may sense the logic state of memory cell 405 by comparing the third voltage to the reference voltage (e.g., by latching or firing the third voltage and the reference voltage).

Several benefits may be realized from using the parasitic capacitance 425 to boost the first voltage to the second voltage, and from using the shift node 450 and capacitor 440-a to shift the second voltage to the third voltage, as illustrated by circuit diagram 400. In some cases, the benefits may include reducing the area of the memory device, which may also decrease fabrication time and costs. In some cases, an amount of parasitic effects on the integration node 415 may be reduced (e.g., because circuitry coupling the integration node 415 with the cascode 410 may be shortened). Reducing the amount of parasitic effects on the integration node 415 may enable the circuit to produce a voltage boost more quickly and accurately than with an additional capacitor.

Figure 5:
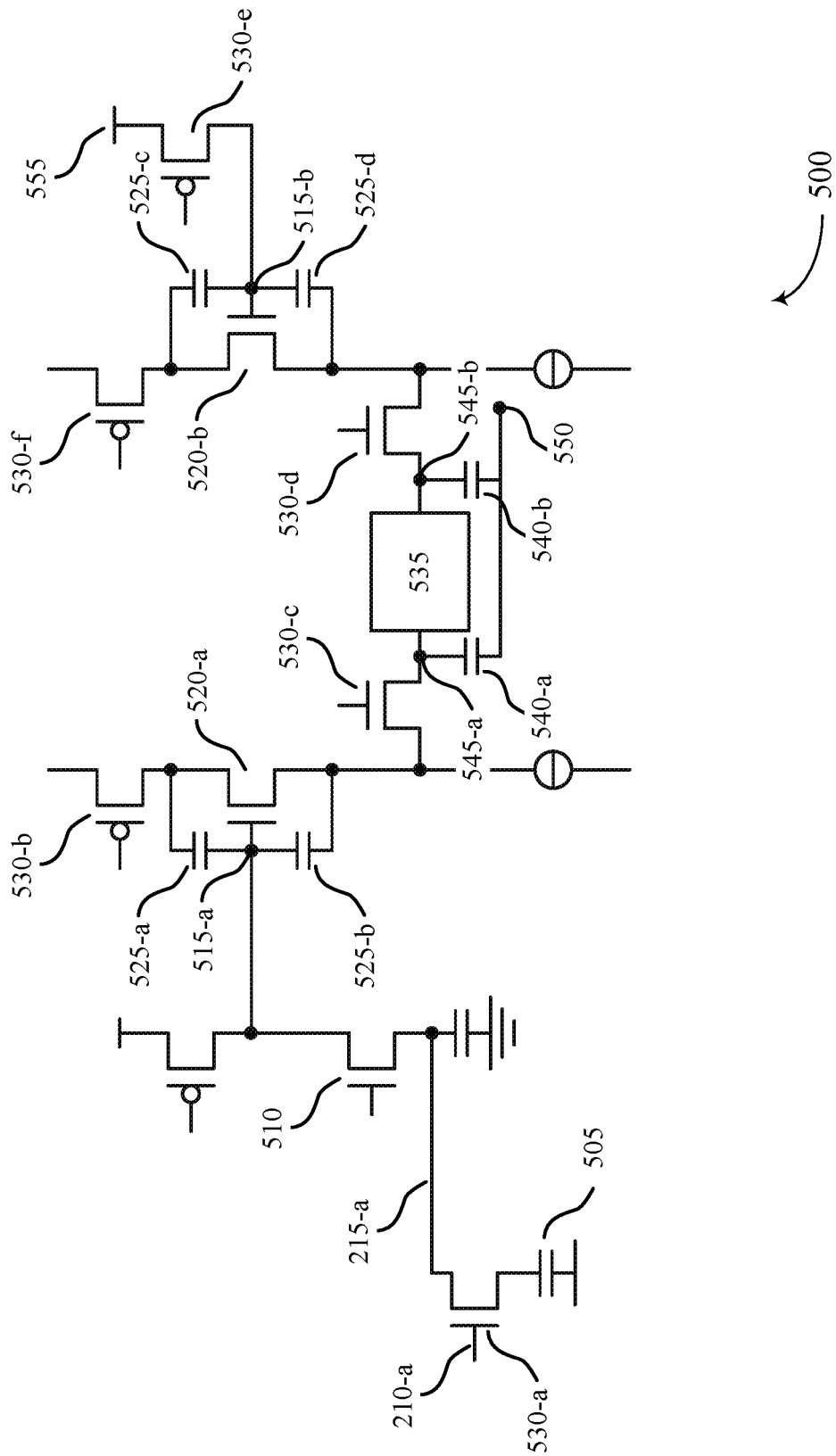
FIG. 5 illustrates an example of a circuit diagram that supports sensing techniques for a memory cell in accordance with examples as disclosed herein.

FIG. 5 illustrates an example of a circuit diagram 500 that supports sensing techniques for a memory cell in accordance with examples as disclosed herein. In some examples, circuit diagram 500 may represent a portion of a memory device, where the memory device may include components of a memory die as described with reference to FIG. 2. For example, circuit diagram 500 may be associated with a memory cell 505, which may be an example of a memory cell described with reference to FIGS. 2 and 3. Circuit diagram 500 may also include a word line 210-*a*, a digit line 215-*a*, and a sense component 535 (e.g., a latch), which may be coupled with memory cell 505 and may be examples of a word line 210, a digit line 215, and a sense component described with reference to FIG. 2. In some cases, portions of circuit diagram 500 may represent portions of circuit diagram 400. The memory device may employ portions of the circuit illustrated in circuit diagram 500 to perform one or more sensing operations with respect to memory cell 505 (e.g., in order to sense a logic state of memory cell 505).

As described above with reference to FIG. 4, the footprint of the memory device may be reduced by boosting and shifting a voltage associated with the memory cell 505 using various circuit components. For example a first voltage associated with the memory cell may be boosted to a second voltage using a first parasitic capacitance 525 (e.g., 525-*a* and/or 525-*b*) of a first transistor 520-*a* and the second voltage may be shifted to a third voltage using one or more capacitors 540 associated with sense component 535. The footprint of memory device may be reduced by performing similar operations on a reference voltage source. For example, a first reference voltage may be boosted to a second reference voltage using a second parasitic capacitance 525 (e.g., 525-*c* and/or 525-*d*) of a second transistor 520-*b* and the second reference voltage may be shifted to a third reference voltage using one or more capacitors 540 associated with sense component 535.

As described above with reference to FIG. 4, the memory device may activate a transistor 530-*a* (e.g., via word line 210-*b*) and a cascode 510-*a* to couple the memory cell 505 with sense component 535. The memory device may also activate transistor 530-*b* to switch on the first transistor 520-*a* (e.g., where transistor 520-*a* may be in a source-follower configuration). When transistor 530-*b* switches on, parasitic capacitances 525-*a* and 525-*b* (e.g., a first parasitic capacitance 525) associated with the first transistor 520-*a* may boost a first voltage associated with memory cell 505 to a second voltage. In some cases, parasitic capacitances 525-*a* and 525-*b* may represent physical components of the circuit. In some cases, parasitic capacitances 525-*a* and 525-*b* may not represent physical components of the circuit, and may instead represent a parasitic capacitance associated with one or more physical components of the first transistor 520-*a*. The second voltage (e.g., second voltage signal) may be developed on a first integration node 515-*a* across parasitic capacitances 525-*a* and 525-*b*.

In some examples, transistor 530-*c* (e.g., a transistor) may be switched on, such that the second voltage may also be applied to a first node 545-*a* of sense component 535. Transistor 530-*c* may be switched off once the second voltage is developed on first node 545-*a*, such that sense component 535 may be isolated from the first transistor 520-*a* and the memory cell 505. The second voltage may be shifted to a third voltage at first node 545-*a*, where first node 545-*a* may be coupled with a first plate of a first capacitor 540-*a*. First capacitor 540-*a* may store data associated with memory cell 505, as represented by the second or third voltage. In some cases, a second plate of first capacitor 540-*a* may be coupled with a shift node 550, and the shift node 550 may be driven to a lower voltage in order to shift the second voltage to the third voltage at first node 545-*a* (e.g., via first capacitor 540-*a*). Similar operations may be performed simultaneously to develop a reference voltage on a second node 545-*b* of the sense component 535, as described below.

For example, the memory device may activate a transistor 530-*e* (e.g., a transistor) to couple a reference voltage source 555 with sense component 535. The memory device may also activate transistor 530-*f* to switch on a second transistor 520-*b* (e.g., where transistor 520-*b* may be in a source-follower configuration). When transistor 530-*f* switches on, parasitic capacitances 525-*c* and 525-*d* (e.g., a second parasitic capacitance 525) associated with the second transistor 520-*b* may boost a first reference voltage associated with reference voltage source 555 to a second reference voltage.

In some cases, parasitic capacitances 525-*c* and 525-*d* may represent physical components of the circuit. In some cases, parasitic capacitances 525-*c* and 525-*d* may not represent physical components of the circuit, and may instead represent a parasitic capacitance associated with one or more physical components of the second transistor 520-*b*. In one example, a drain and a source of the second transistor 520-*b* may transition from a grounded state to a high-voltage state when transistor 530-*f* switches on. This transition may boost the first reference voltage to the second reference voltage using the parasitic capacitances 525-*c* and 525-*d* associated with a MOS of the second transistor 520-*b*. As such, the second reference voltage (e.g., second reference voltage signal) may be developed on a second integration node 515-*b* across parasitic capacitances 525-*c* and 525-*d*.

In some examples, transistor 530-*d* (e.g., a transistor) may be switched on, such that the second reference voltage may also be applied to a second node 545-*b* of sense component 535. Transistor 530-*d* may be switched off once the second reference voltage is developed on second node 545-*b*, such that sense component 535 may be isolated from the second transistor 520-*b* and the reference voltage source 555. The second reference voltage may be shifted to a third reference voltage at second node 545-*b*, where second node 545-*b* may be coupled with a first plate of a second capacitor 540-*b*. Second capacitor 540-*b* may store data associated with reference voltage source 555, as represented by the second or third reference voltage. In some cases, a second plate of second capacitor 540-*b* may be couple with shift node 550, and shift node 550 may be driven to a lower voltage in order to shift the second reference voltage to the third reference voltage at second node 545-*b* (e.g., via second capacitor 540-*b*). Sense component 535 may sense the logic state of memory cell 505 by comparing the third voltage to the third reference voltage (e.g., by latching or firing the third voltage and the third reference voltage). In some cases, the memory device may be configured such that the third voltage and the third reference voltage are produced simultaneously, and such that the two voltages may be sampled in a same instant of time.

Several benefits may be realized from the circuit illustrated by circuit diagram 500. In some cases, the benefits may include reducing the area of the memory device, which may also decrease fabrication time and costs. In some cases, an amount of parasitic effects on the integration nodes 515 may be reduced (e.g., because circuitry coupling the integration node 515-*a* with cascode 510 and coupling the integration node 515-*b* with transistor 530-*e* may be shortened). Reducing the amount of parasitic effects on the integration nodes 515 may enable the circuit to produce a voltage boost more quickly and accurately. Further, the third voltage and the third reference voltage may be produced simultaneously, which may allow the memory device to sample the signals from the reference voltage source 555 and the memory cell 505 in one step, which may decrease latency and increase read and/or write times of the memory device.

Figure 6:
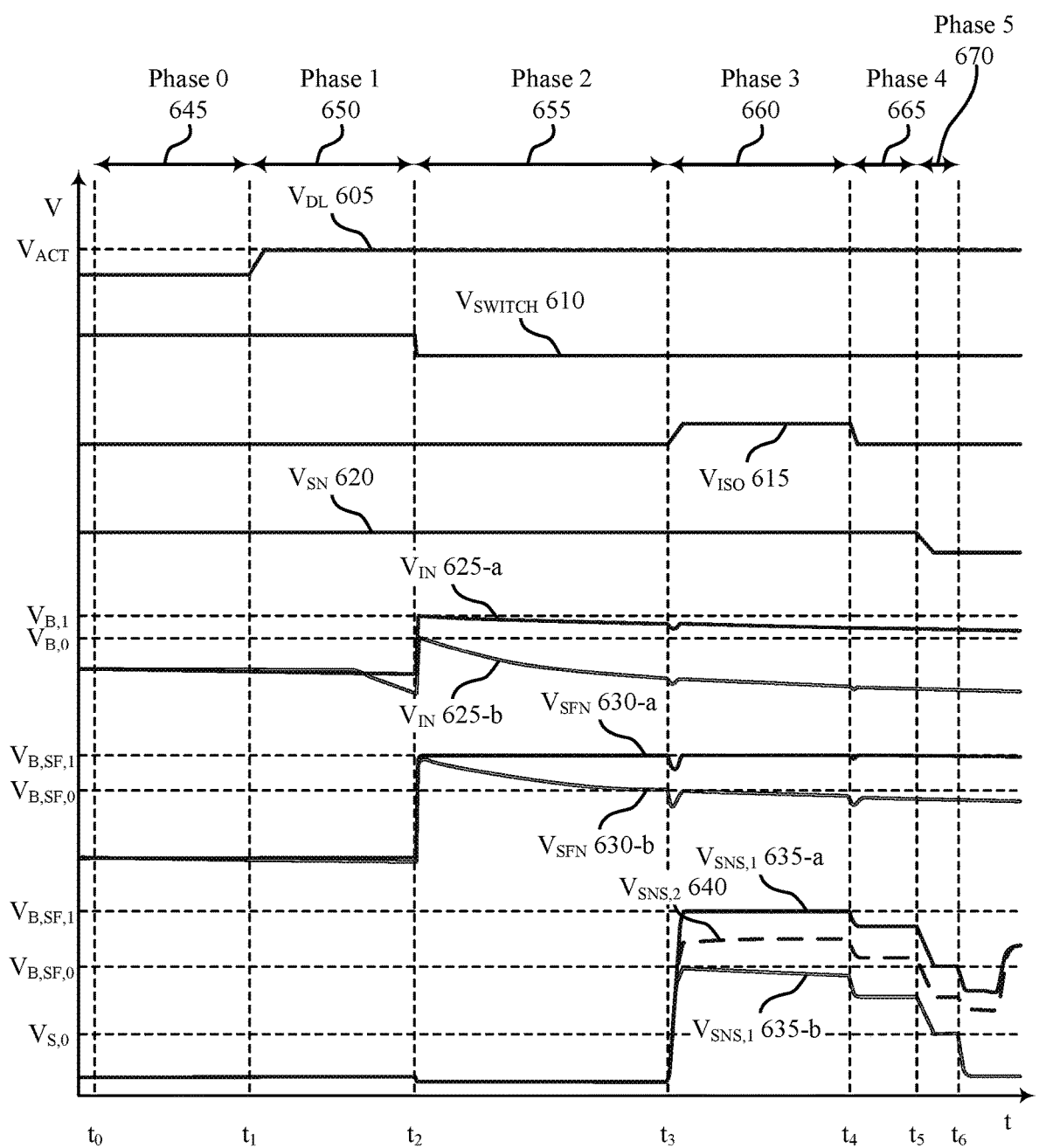
FIG. 6 illustrates an example of a timing diagram that supports sensing techniques for a memory cell in accordance with examples as disclosed herein.

FIG. 6 illustrates an example of a timing diagram 600 that supports sensing techniques for a memory cell in accordance with examples as disclosed herein. The timing diagram 600 illustrates procedures during a read operation, such as during one or more sense portions of a read operation. A sense operation may correspond to a time period between t1 and t6 that includes a first phase 650 through a fifth phase 670. The read operation and other operations may extend into a time period after t6. The timing diagram 600 shows various voltages which may illustrate techniques for memory cell sensing. The voltages may be associated with the components of one or more circuits that may correspond to circuit diagrams 400 and/or 500, and described with reference to FIGS. 4 and 5. The timing diagram 600 may additionally or alternatively illustrate various voltages associated with a memory device, which may be an example of a memory device described with reference to FIG. 1. Timing diagram 600 may illustrate methods to boost a memory cell voltage at t2 using a parasitic capacitance of a transistor in a source-follower configuration. Timing diagram 600 may also illustrate methods to shift a boosted voltage at t5 using a shift node coupled to one or more capacitors of a sense component.

During an initial phase 645 (e.g., beginning at t0), which may also be referred to as an idle period, a digit line voltage (VDL) 605 and other voltages may be kept at a constant voltage (e.g., within a threshold of a constant voltage). In some cases, the constant voltages may be zero volts, a positive voltage, or a negative voltage. The initial phase may represent a time before the beginning of the read operation and the corresponding sense operation. The digit line voltage 605 may be an example of a voltage applied to or measured on a digit line 215 as described with reference to FIGS. 2, 4, and 5.

At t1, a first phase 650 may begin. A voltage may be applied to the digit line (e.g., digit line 215) such that VDL 605 may be driven from a constant initial voltage to an activated voltage (VACT). The digit line may be used to access the memory cell for read and sense operations (e.g., via VDL 605). For example, the digit line may couple the memory cell with a sense component via a transistor in source-follower configuration (transistor 420 and 520 as described with reference to FIGS. 4 and 5).

At t2, a second phase 655 may begin as a second transistor (e.g., transistor 430-*b* described with reference to FIG. 4) coupled with the transistor is switched on, by applying a switch voltage 610 (e.g., VSWITCH). The switch voltage 610 may move from a high voltage to a low voltage to switch on the second transistor on when the second transistor is a p-type transistor. In other examples, when the second transistor is an n-type transistor the switch voltage 610 may move from a low voltage to a high voltage to activate the second transistor. When the second transistor switches on (e.g., at or after t2), parasitic capacitances associated with the transistor may boost a first voltage associated with the memory cell to a second voltage (e.g., at or after t2), where the first and the second voltage may be based on a logic state stored by the memory cell. In one example, a drain and a source of the transistor may transition from a grounded state to a high-voltage state when the second transistor switches on, which may boost the first voltage to the second voltage through feedback parasitic capacitances associated with a MOS of the transistor. The transistor may be coupled with an integration node and a source follower node, such that a voltage of the integration node (VIN) 625 (e.g., node between transistor 420 and cascode 410 as described with reference to FIG. 4) and a voltage of the source follower node (VSFN) 630 (e.g., node between transistor 420 and transistor 430-*c* as described with reference to FIG. 4) may be boosted when the second transistor switches on. In some cases, VIN 625 may be higher than VSFN 630.

When the second transistor switches on the transistor (e.g., at or after t2), VIN 625 may be boosted from a first voltage to a second voltage (e.g., at or after t2), where the first voltage and the second voltage may be based on a logic state of the memory cell. In a first example where the memory cell stores a logic state of "1," VIN 625-*a* may be boosted to a second voltage associated with a logic state of "1" (VB,1). In a second example where the memory cell stores a logic state of "0", VIN 625-*b* may be boosted to a second voltage associated with a logic state of "0" (VB,0). VSFN 630 may also be boosted from a first voltage to a second voltage based on the logic state of the memory cell (e.g., at or after t2). In one example, VSFN 630-*a* or VSFN 630-*b* may be boosted to a second voltage associated with a logic state of "1" (VB,SF,1) if the memory cell stores either logic state. If the memory cell stores a logic state of "1" the second voltage may remain at VB,SF,1, while if the memory cell stores a logic state of "0," the second voltage may fall to a voltage associated with a logic state of "0" (VB,SF,0) at or before t3.

At t3, a third phase 660 may begin, and an isolator transistor (e.g., transistor 430-*c* or 530-*c*, or 530-*c* as described with reference to FIGS. 4 and 5) that selectively couples the transistor with the sense component may be activated (e.g., by applying an isolation transistor voltage (VISO) 615 at or after t3). The isolator transistor may couple a first node of the sense component with the transistor (e.g., may couple the sense component with the source follower node). As such, a voltage 635 (e.g., VSNS,1) of the first node (e.g., node 445-*a* and 545-*b* described with reference to FIGS. 4 and 5) of the sense component may be raised to a same voltage as VSFN 630 (e.g., at or after t3). For example, VSNS,1 635-*a* may rise to VB,SF,1 if the logic state of the memory cell is "1" or VSNS,1 635-*b* may rise to VB,SF,0 if the logic state of the memory cell is "0". As described with reference to FIG. 5, a second isolator transistor (e.g., 530-*d* as described with reference to FIG. 5) may couple a second node of the sense component to a reference voltage source (e.g., via a second transistor in source-follower configuration). As such, a voltage of the second node of the sense component (VSNS,2) 640 may rise to a reference voltage at or after t3.

At t4, a fourth phase 665 may begin, and the isolator transistor may be deactivated (e.g., at or after t4), which may isolate the sense component from the transistor. The second isolator transistor may also be deactivated, which may isolate the sense component from the reference voltage source and from the second transistor. In some cases, isolating the sense component may result in slightly lower VSNS,1 635 and VSNS,2 640, as illustrated at t4. In some cases, the change in VSNS,1 635 and VSNS,2 640 may be small or undetectable.

At t5, a fifth phase 670 may begin, and a voltage 620 (e.g., VSN) of a shift node (e.g., shift node 450 or 550 described with reference to FIGS. 4 and 5) may be shifted (e.g., at or after t5) in order to shift VSNS,1 635 and VSNS,2 640. In some cases, the shift node may be coupled to one or both of the first and second nodes of the sense component, such that lowering the VSN 620 may shift or lower VSNS,1 635 and VSNS,2 640. The shift node may be coupled to the first node of the sense component via a first capacitor, such that VSNS,1 635 may be shifted via the first capacitor. The shift node may also be coupled to the second node of the sense component via a second capacitor, such that VSNS,2 640 may be shifted via the second capacitor. In one example, VSNS,1 635-a may be shifted to a voltage corresponding to a logic state of "1" (VS,1). In some cases, VS,1 may be a same voltage or near the voltage of VB,SF,0, and in other cases VS,1 may be different from VB,SF,0. In another example, VSNS,1 635-b may be shifted to a voltage corresponding to a logic state of "0" (VS,0). VSNS,2 640 may also be shifted to a different voltage (e.g., to a lower voltage). In some cases, the shifted VSNS,1 635 and VSNS,2 640 may correspond to voltage levels that may enable the sense component to sense the logic state of the memory cell.

At or after t6, the sense component may fire and may sense the logic state of the memory cell using VSNS,1 635 (e.g., VSNS,1 635-a or VSNS,1 635-b) and VSNS,2 640. The read operation may continue after t6 with one or more other operations associated with reading the logic state of the memory cell.

Figure 7:
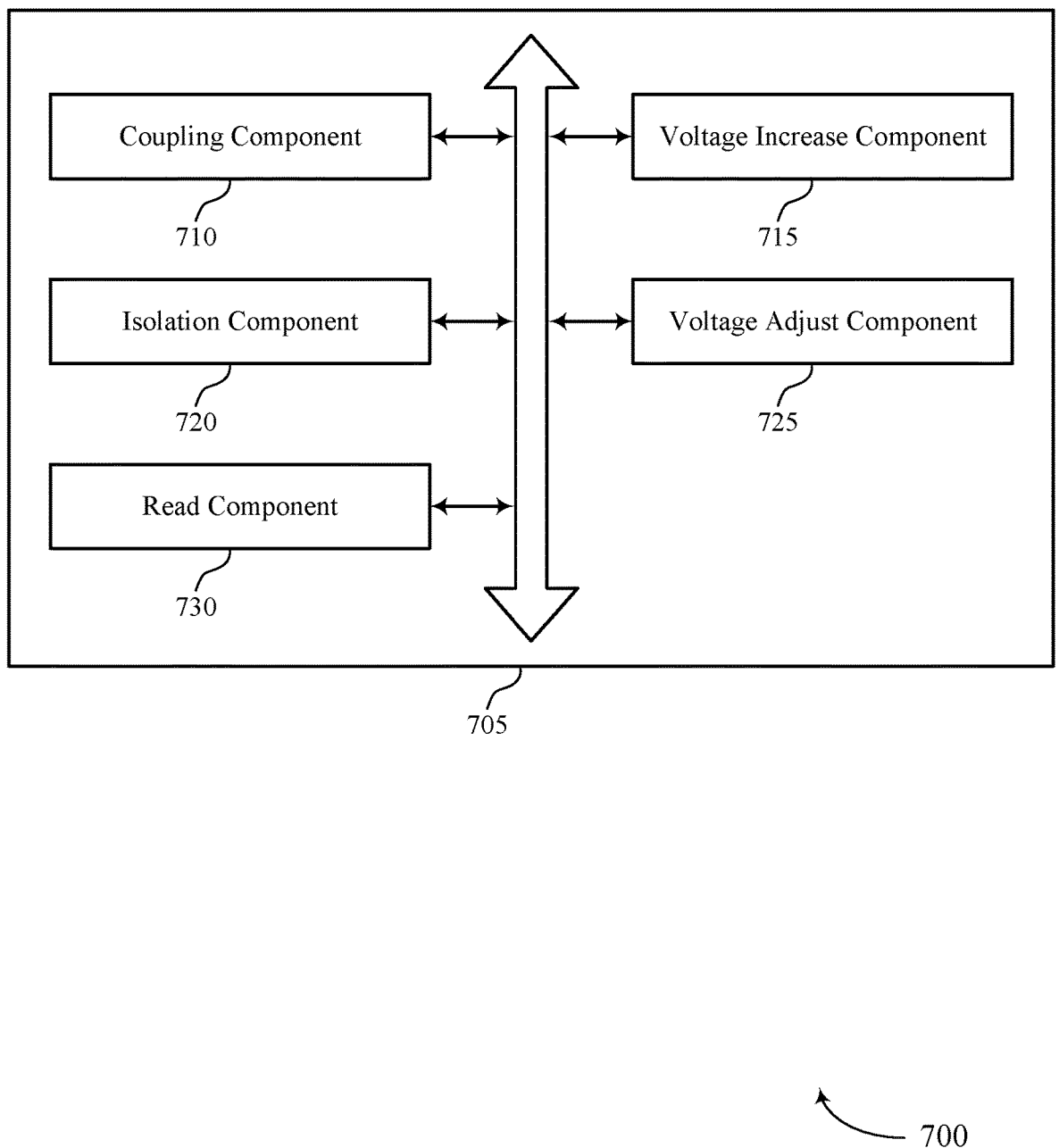
FIG. 7 shows a block diagram of a memory device that supports sensing techniques for a memory cell in accordance with examples as disclosed herein.

FIG. 7 shows a block diagram 700 of a memory device 705 that supports sensing techniques for a memory cell in accordance with examples as disclosed herein. The memory device 705 may be an example of aspects of a memory device as described with reference to FIGS. 4 through 6. The memory device 705 may include a coupling component 710, a voltage increase component 715, an isolation component 720, a voltage adjust component 725, and a read component 730. Each of these modules may communicate, directly or indirectly, with one another (e.g., via one or more buses).

The coupling component 710 may couple a gate of a transistor that is in a source-follower configuration with a memory cell to apply a first voltage to the gate of the transistor. In some examples, the coupling component 710 may couple a gate of a second transistor in a source-follower configuration with a reference voltage source to apply a first reference voltage to the gate of the second transistor. In some examples, the coupling component 710 may activate a cascode of the memory cell, where coupling the gate with the memory cell is based on activating the cascode. In some examples, the coupling component 710 may apply an activation voltage to a word line of the memory cell, where coupling the gate with the memory cell is based on applying the activation voltage to the word line.

The voltage increase component 715 may increase, after coupling the gate with the memory cell, a first node of the transistor to a second voltage based on a parasitic capacitance associated with the transistor. In some examples, the voltage increase component 715 may perform signal integration of the first voltage based on the parasitic capacitance associated with the transistor, where increasing the first node of the transistor to the second voltage is based on performing the signal integration. In some examples, the voltage increase component 715 may couple a second node of the transistor with a voltage source based on coupling the gate of the transistor with the memory cell, where increasing the first node to the second voltage is based on coupling the second node with the voltage source. In some examples, the voltage increase component 715 may activate a second transistor coupled with the voltage source and the second node of the transistor. In some examples, the voltage increase component 715 may increase, based on coupling the gate of the second transistor with the reference voltage source, a first node of the second transistor to a second reference voltage based on a parasitic capacitance associated with the second transistor.

The isolation component 720 may isolate a latch from the first node of the transistor based on increasing the first node to the second voltage. In some examples, the isolation component 720 may isolate the latch from the first node of the second transistor based on increasing the first node of the second transistor to the second reference voltage.

The voltage adjust component 725 may adjust, at a node of the latch, the second voltage to a third voltage based on isolating the latch from the first node. In some examples, the voltage adjust component 725 may apply a signal to a first plate of a capacitor that includes a second plate coupled with the node of the latch based on isolating the latch from the first node, where adjusting the second voltage to the third voltage is based on applying the signal. In some examples, the voltage adjust component 725 may adjust, at a second node of the latch, the second reference voltage to a third reference voltage based on isolating the latch from the first node of the second transistor.

The read component 730 may determine a logic state stored by the memory cell based on adjusting the second voltage to the third voltage. In some examples, the read component 730 may compare the third voltage with the third reference voltage, where determining the logic state stored by the memory cell is based on comparing the third voltage with the third reference voltage.

Figure 8:
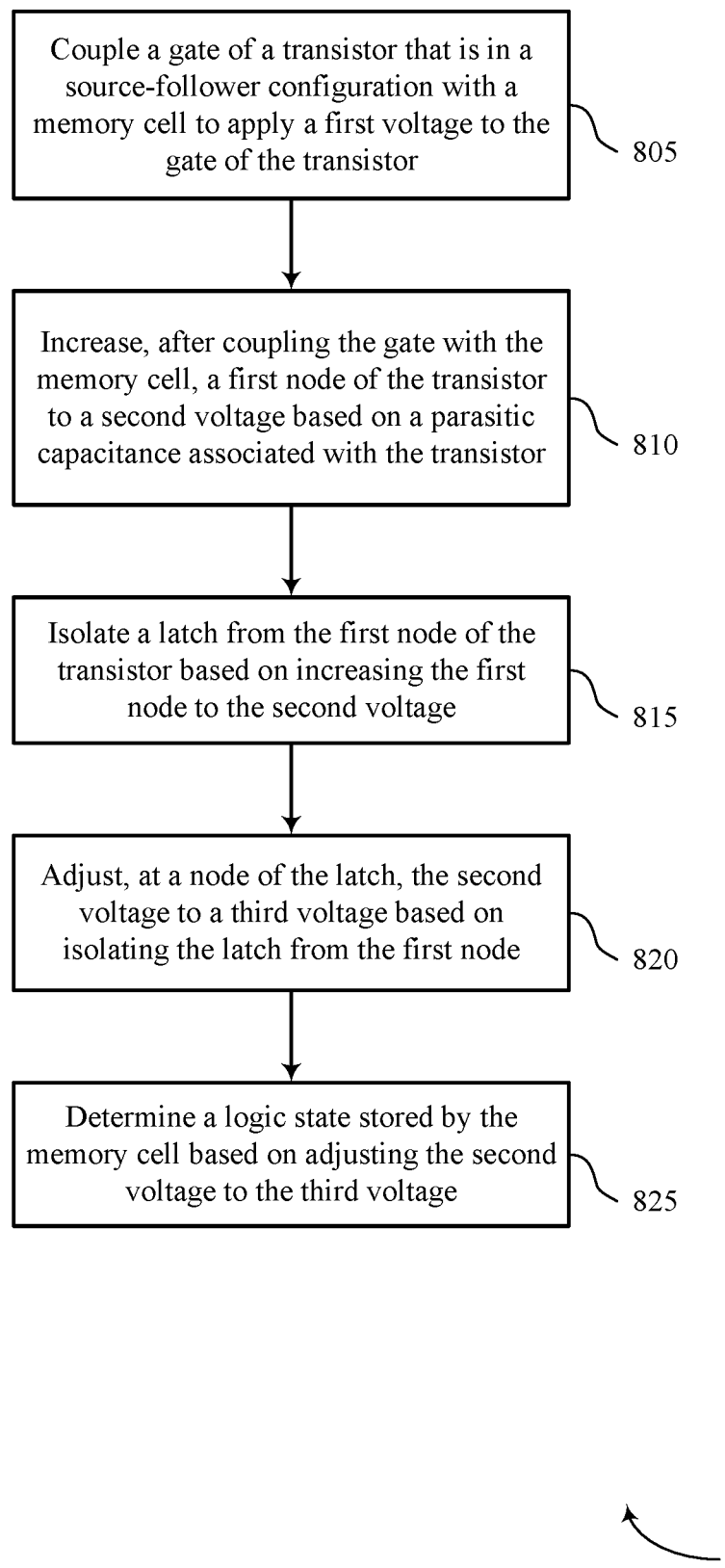
FIGS. 8 through 10 show flowcharts illustrating a method or methods that support sensing techniques for a memory cell in accordance with examples as disclosed herein.

FIG. 8 shows a flowchart illustrating a method or methods 800 that supports sensing techniques for a memory cell in accordance with examples as disclosed herein. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may couple a gate of a transistor that is in a source-follower configuration with a memory cell to apply a first voltage to the gate of the transistor. The operations of 805 may be performed according to the methods described herein. In some examples, aspects of the operations of 805 may be performed by a coupling component as described with reference to FIG. 7.

At 810, the memory device may increase, after coupling the gate with the memory cell, a first node of the transistor to a second voltage based on a parasitic capacitance associated with the transistor. The operations of 810 may be performed according to the methods described herein. In some examples, aspects of the operations of 810 may be performed by a voltage increase component as described with reference to FIG. 7.

At 815, the memory device may isolate a latch from the first node of the transistor based on increasing the first node to the second voltage. The operations of 815 may be performed according to the methods described herein. In some examples, aspects of the operations of 815 may be performed by an isolation component as described with reference to FIG. 7.

At 820, the memory device may adjust, at a node of the latch, the second voltage to a third voltage based on isolating the latch from the first node. The operations of 820 may be performed according to the methods described herein. In some examples, aspects of the operations of 820 may be performed by a voltage adjust component as described with reference to FIG. 7.

At 825, the memory device may determine a logic state stored by the memory cell based on adjusting the second voltage to the third voltage. The operations of 825 may be performed according to the methods described herein. In some examples, aspects of the operations of 825 may be performed by a read component as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for coupling a gate of a transistor that is in a source-follower configuration with a memory cell to apply a first voltage to the gate of the transistor, increasing, after coupling the gate with the memory cell, a first node of the transistor to a second voltage based on a parasitic capacitance associated with the transistor, isolating a latch from the first node of the transistor based on increasing the first node to the second voltage, adjusting, at a node of the latch, the second voltage to a third voltage based on isolating the latch from the first node, and determining a logic state stored by the memory cell based on adjusting the second voltage to the third voltage.

Some examples of the method 800 and the apparatus described herein may further include operations, features, means, or instructions for performing signal integration of the first voltage based on the parasitic capacitance associated with the transistor, where increasing the first node of the transistor to the second voltage may be based on performing the signal integration.

Some examples of the method 800 and the apparatus described herein may further include operations, features, means, or instructions for coupling a second node of the transistor with a voltage source based on coupling the gate of the transistor with the memory cell, where increasing the first node to the second voltage may be based on coupling the second node with the voltage source.

In some examples of the method 800 and the apparatus described herein, coupling the second node of the transistor with the voltage source further may include operations, features, means, or instructions for activating a second transistor coupled with the voltage source and the second node of the transistor.

Some examples of the method 800 and the apparatus described herein may further include operations, features, means, or instructions for applying a signal to a first plate of a capacitor that includes a second plate coupled with the node of the latch based on isolating the latch from the first node, where adjusting the second voltage to the third voltage may be based on applying the signal.

Some examples of the method 800 and the apparatus described herein may further include operations, features, means, or instructions for coupling a gate of a second transistor in a source-follower configuration with a reference voltage source to apply a first reference voltage to the gate of the second transistor, increasing, based on coupling the gate of the second transistor with the reference voltage source, a first node of the second transistor to a second reference voltage based on a parasitic capacitance associated with the second transistor, isolating the latch from the first node of the second transistor based on increasing the first node of the second transistor to the second reference voltage, and adjusting, at a second node of the latch, the second reference voltage to a third reference voltage based on isolating the latch from the first node of the second transistor.

Some examples of the method 800 and the apparatus described herein may further include operations, features, means, or instructions for comparing the third voltage with the third reference voltage, where determining the logic state stored by the memory cell may be based on comparing the third voltage with the third reference voltage.

Some examples of the method 800 and the apparatus described herein may further include operations, features, means, or instructions for activating a cascode of the memory cell, where coupling the gate with the memory cell may be based on activating the cascode.

Some examples of the method 800 and the apparatus described herein may further include operations, features, means, or instructions for applying an activation voltage to a word line of the memory cell, where coupling the gate with the memory cell may be based on applying the activation voltage to the word line.

Figure 9:
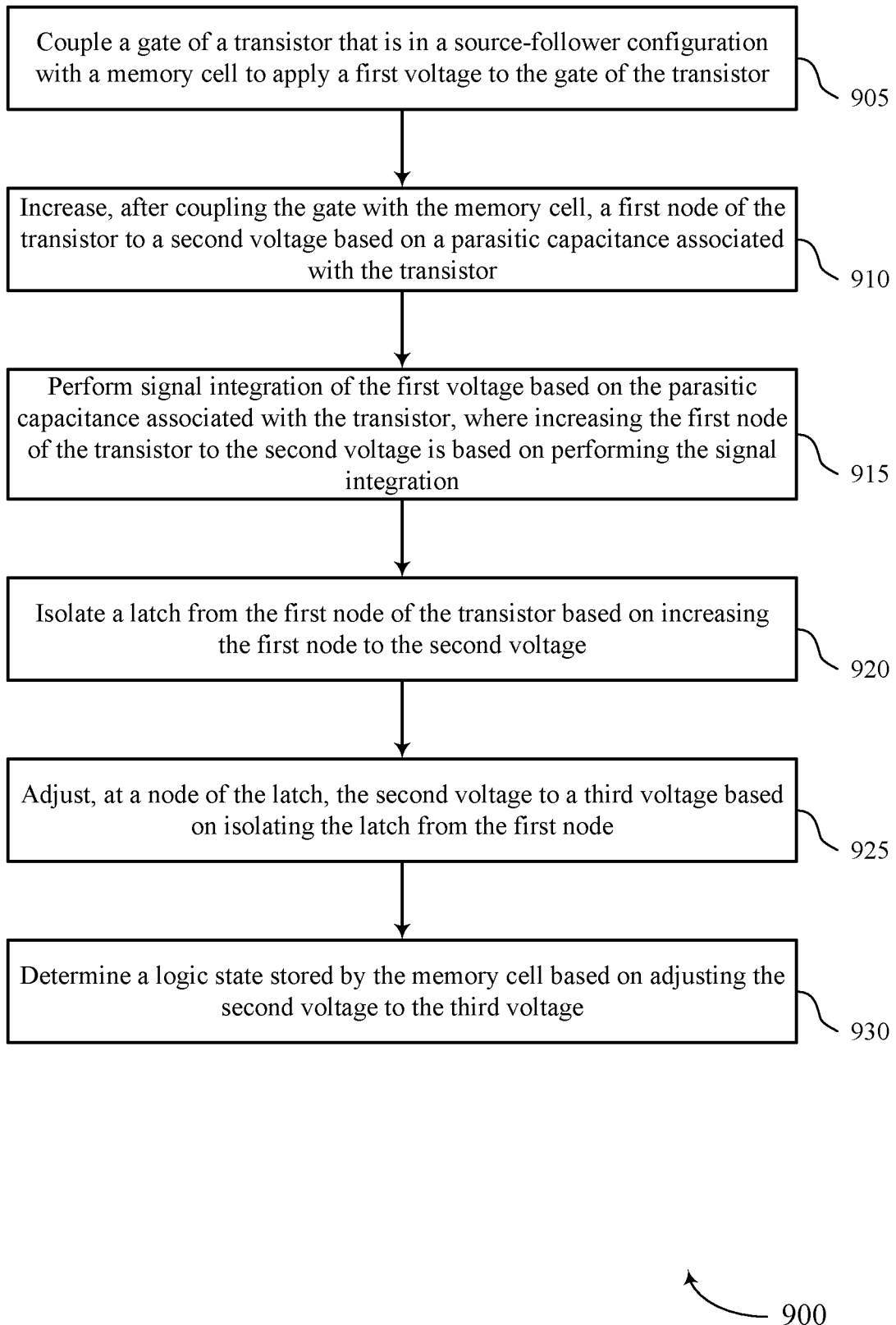

FIG. 9 shows a flowchart illustrating a method or methods 900 that supports sensing techniques for a memory cell in accordance with examples as disclosed herein. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may couple a gate of a transistor that is in a source-follower configuration with a memory cell to apply a first voltage to the gate of the transistor. The operations of 905 may be performed according to the methods described herein. In some examples, aspects of the operations of 905 may be performed by a coupling component as described with reference to FIG. 7.

At 910, the memory device may increase, after coupling the gate with the memory cell, a first node of the transistor to a second voltage based on a parasitic capacitance associated with the transistor. The operations of 910 may be performed according to the methods described herein. In some examples, aspects of the operations of 910 may be performed by a voltage increase component as described with reference to FIG. 7.

At 915, the memory device may perform signal integration of the first voltage based on the parasitic capacitance associated with the transistor, where increasing the first node of the transistor to the second voltage is based on performing the signal integration. The operations of 915 may be performed according to the methods described herein. In some examples, aspects of the operations of 915 may be performed by a voltage increase component as described with reference to FIG. 7.

At 920, the memory device may isolate a latch from the first node of the transistor based on increasing the first node to the second voltage. The operations of 920 may be performed according to the methods described herein. In some examples, aspects of the operations of 920 may be performed by an isolation component as described with reference to FIG. 7.

At 925, the memory device may adjust, at a node of the latch, the second voltage to a third voltage based on isolating the latch from the first node. The operations of 925 may be performed according to the methods described herein. In some examples, aspects of the operations of 925 may be performed by a voltage adjust component as described with reference to FIG. 7.

At 930, the memory device may determine a logic state stored by the memory cell based on adjusting the second voltage to the third voltage. The operations of 930 may be performed according to the methods described herein. In some examples, aspects of the operations of 930 may be performed by a read component as described with reference to FIG. 7.

Figure 10:
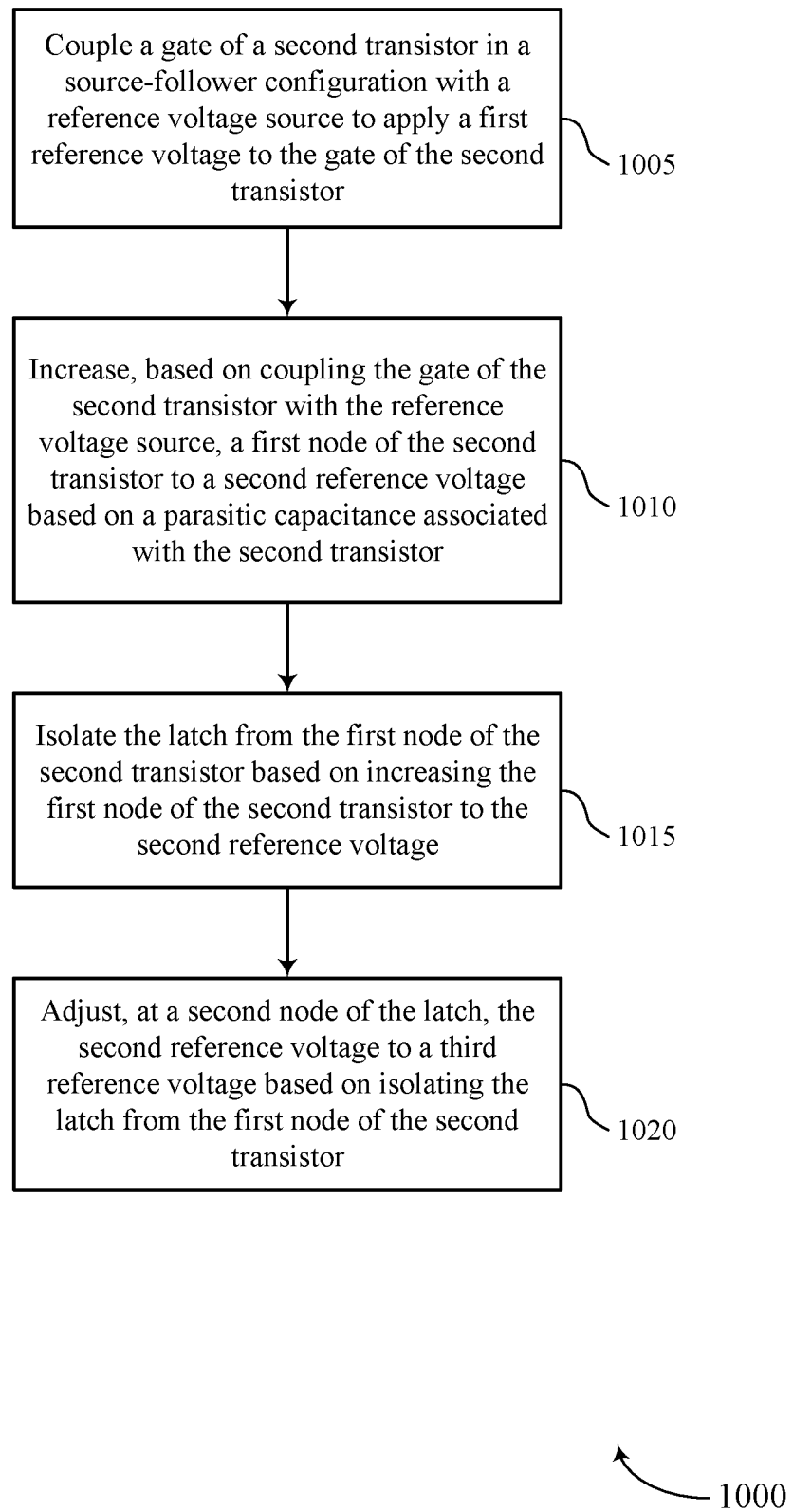

FIG. 10 shows a flowchart illustrating a method or methods 1000 that supports sensing techniques for a memory cell in accordance with examples as disclosed herein. The operations of method 1000 may be implemented by a memory device or its components as described herein. For example, the operations of method 1000 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1005, the memory device may couple a gate of a second transistor in a source-follower configuration with a reference voltage source to apply a first reference voltage to the gate of the second transistor. The operations of 1005 may be performed according to the methods described herein. In some examples, aspects of the operations of 1005 may be performed by a coupling component as described with reference to FIG. 7.

At 1010, the memory device may increase, based on coupling the gate of the second transistor with the reference voltage source, a first node of the second transistor to a second reference voltage based on a parasitic capacitance associated with the second transistor. The operations of 1010 may be performed according to the methods described herein. In some examples, aspects of the operations of 1010 may be performed by a voltage increase component as described with reference to FIG. 7.

At 1015, the memory device may isolate the latch from the first node of the second transistor based on increasing the first node of the second transistor to the second reference voltage. The operations of 1015 may be performed according to the methods described herein. In some examples, aspects of the operations of 1015 may be performed by an isolation component as described with reference to FIG. 7.

At 1020, the memory device may adjust, at a second node of the latch, the second reference voltage to a third reference voltage based on isolating the latch from the first node of the second transistor. The operations of 1020 may be performed according to the methods described herein. In some examples, aspects of the operations of 1020 may be performed by a voltage adjust component as described with reference to FIG. 7.

It should be noted that the methods described above describe possible implementations, and that the operations and the steps may be rearranged or otherwise modified and that other implementations are possible. Further, portions from two or more of the methods may be combined.

An apparatus is described. The apparatus may include a memory cell, a transistor in a source-follower configuration and selectively couplable with the memory cell, the transistor including a parasitic capacitance to increase a voltage of a signal received from the memory cell, a latch selectively couplable with the transistor and configured to determine a logic state stored by the memory cell, and a capacitor coupled with the latch and selectively couplable with the transistor, the capacitor configured to adjust the voltage increased by the transistor.

Some examples of the apparatus may include a voltage source selectively couplable with a second node of the transistor, where the parasitic capacitance of the transistor increases the voltage based on selectively coupling the voltage source with the second node of the transistor. Some examples of the apparatus may include a second transistor coupled with the voltage source and the second node of the transistor, the second transistor configured to selectively couple the voltage source with the second node of the transistor. In some examples, the capacitor includes a first plate coupled with a shift node and a second plate coupled with a first node of the latch, the shift node configured to receive a signal to adjust the voltage increased by the transistor.

Some examples may further include comparing the adjusted voltage with a reference voltage, where determining the logic state stored by the memory cell may be based on comparing the adjusted voltage with the reference voltage. Some examples of the apparatus may include a cascode coupled with a digit line associated with the memory cell and configured to selectively couple the transistor with the digit line. Some examples of the apparatus may include a word line coupled with the memory cell and configured to selectively couple the memory cell with the digit line.

An apparatus is described. The apparatus may include a memory cell, a first transistor in a source-follower configuration selectively couplable with the memory cell, the first transistor including a first parasitic capacitance to increase a voltage of a signal received from the memory cell, a reference voltage source, a second transistor in a source-follower configuration selectively couplable with the reference voltage source, the second transistor including a second parasitic capacitance to increase a voltage of a signal received from the reference voltage source, a latch selectively couplable with the first transistor and selectively couplable with the second transistor, the latch configured to determine a logic state stored by the memory cell, a first capacitor coupled with the latch and selectively couplable with the first transistor, the first capacitor configured to adjust the voltage increased by the first transistor, and a second capacitor coupled with the latch and selectively couplable with the second transistor, the second capacitor configured to adjust the voltage increased by the second transistor.

Some examples of the apparatus may include a voltage source selectively couplable with a second node of the first transistor and a second node of the second transistor. Some examples of the apparatus may include a third transistor coupled with the voltage source and the second node of the first transistor, the third transistor configured to selectively couple the voltage source with the second node of the first transistor, and a fourth transistor coupled with the voltage source and the second node of the second transistor, the fourth transistor configured to selectively couple the voltage source with the second node of the second transistor.

In some examples, the first capacitor includes a first plate coupled with a shift node and a second plate coupled with a first node of the latch, the shift node configured to receive a first signal to adjust the voltage increased by the first transistor, and the second capacitor includes a first plate coupled with the shift node and a second plate coupled with a second node of the latch, the shift node configured to receive a second signal to adjust the voltage increased by the second transistor. In some examples, the second signal may be the same as the first signal. Some examples may further include comparing the voltage adjusted by the first capacitor with the voltage adjusted by the second capacitor, where determining the logic state stored by the memory cell may be based on comparing the voltage adjusted by the first capacitor with the voltage adjusted by the second capacitor.

Some examples of the apparatus may include a cascode coupled with a digit line associated with the memory cell and configured to selectively couple the first transistor with the digit line. Some examples of the apparatus may include a word line coupled with the memory cell and configured to selectively couple the memory cell with the digit line. Some examples of the apparatus may include a fourth transistor coupled with the reference voltage source and the second transistor, the fourth transistor configured to selectively couple the reference voltage source with the second transistor.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   coupling a memory cell with a sense component based at least in part on activating a first transistor using a first voltage;
   activating a second transistor after activating the first transistor, wherein the first voltage is modified to a second voltage based at least in part on activating the second transistor;
   coupling the sense component with the first transistor after activating a third transistor, wherein a third voltage associated with a first node coupled with the sense component is modified by the second voltage based at least in part on activating of the third transistor; and
   determining a logic state of the memory cell by comparing the third voltage with a reference voltage at a second node coupled with the sense component.

2. The method of claim 1, further comprising:
   deactivating the third transistor based at least in part on the third voltage being made equal to the second voltage, wherein determining the logic state is based at least in part on deactivating the third transistor.

3. The method of claim 2, further comprising:
   coupling the sense component with a reference voltage source after activating a fourth transistor based at least in part on activating the second transistor; and
   deactivating the fourth transistor based at least in part on the third voltage being made equal to the second voltage, wherein determining the logic state is based at least in part on deactivating the fourth transistor.

4. The method of claim 2, wherein a voltage level of the third voltage is lower upon deactivating the third transistor.

5. The method of claim 1, wherein the first transistor is in a source-follower configuration.

6. The method of claim 1, wherein the second voltage is based at least in part on feedback parasitic capacitances associated with the first transistor.

7. The method of claim 1, wherein coupling the memory cell with the sense component further comprises:
activating a cascode associated with the memory cell, wherein the second voltage is based at least in part on activation of the cascode.

8. The method of claim 1, wherein the second voltage is based at least in part on the logic state stored by the memory cell.

9. The method of claim 8, wherein a voltage level of the second voltage when the logic state of the memory cell is a first value is greater than the voltage level of the second voltage when the logic state of the memory cell is a second value.

10. The method of claim 1, wherein a voltage level of the third voltage when the logic state of the memory cell is a first value is greater than the voltage level of the third voltage when the logic state of the memory cell is a second value.

11. The method of claim 1, further comprising:
modifying the third voltage associated with the first node coupled with the sense component and the reference voltage at the second node coupled with the sense component by varying a fourth voltage applied to both the first node and the second node.

12. The method of claim 11, wherein modifying the third voltage associated with the first node is based at least in part on a first capacitor coupled to the first node and modifying the reference voltage at the second node is based at least in part on a second capacitor coupled to the second node.

13. An apparatus, comprising:
a memory cell;
a first transistor configured to couple the memory cell with a sense component based at least in part on applying a first voltage to a node coupled with the first transistor, wherein the first transistor is configured to be activated to cause the first voltage to change to a second voltage;
a second transistor configured to couple the first transistor with the sense component, wherein the second transistor is configured to be activated to apply the second voltage to a first node of the sense component;
a third transistor configured to couple a reference voltage source with the sense component, wherein the third transistor is configured to be activated to apply a reference voltage associated with the reference voltage source to a second node of the sense component; and
the sense component configured to determine a logic state of the memory cell by comparing the second voltage with the reference voltage.

14. The apparatus of claim 13, further comprising:
a fourth transistor configured to modify the reference voltage into a second reference voltage.

15. The apparatus of claim 14, wherein both the first transistor and the fourth transistor are in a source-follower configuration.

16. The apparatus of claim 15, wherein:
the first transistor is associated with a first parasitic capacitance and the fourth transistor is associated with a second parasitic capacitance; and
the first voltage on the node is configured to be modified based at least in part on the first parasitic capacitance and the reference voltage supplied by the reference voltage source is configured to be modified based at least in part on the second parasitic capacitance.

17. The apparatus of claim 16, wherein a third node is configured to have the second reference voltage, the third node coupled with the third transistor and the fourth transistor.

18. The apparatus of claim 17, further comprising:
a fifth transistor configured to isolate the sense component from the reference voltage source, wherein the third node is configured to modify the second reference voltage into the reference voltage based at least in part on isolating the sense component from the reference voltage source.

19. The apparatus of claim 18, further comprising:
one or more capacitors coupled with the sense component, the one or more capacitors configured to modify the second voltage into a third voltage concurrently with developing the reference voltage.

20. An apparatus, comprising:
a memory array; and
a controller coupled with the memory array and configured to cause the apparatus to:
couple a memory cell of the memory array with a sense component based at least in part on activating a first transistor using a first voltage;
activate a second transistor after activating the first transistor, wherein the first voltage is modified to a second voltage based at least in part on activating the second transistor;
couple the sense component with the first transistor after activating a third transistor, wherein a third voltage associated with a first node coupled with the sense component is modified by the second voltage based at least in part on activating of the third transistor; and
determine a logic state of the memory cell by comparing the third voltage with a reference voltage at a second node coupled with the sense component.

* * * * *